US007129015B2

(12) United States Patent
Choi

(10) Patent No.: US 7,129,015 B2
(45) Date of Patent: Oct. 31, 2006

(54) SILICON-CONTAINING POLYMER, NEGATIVE TYPE RESIST COMPOSITION COMPRISING THE SAME, AND PATTERNING METHOD FOR SEMICONDUCTOR DEVICE USING THE SAME

(75) Inventor: Sang-jun Choi, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/702,778

(22) Filed: Nov. 6, 2003

(65) Prior Publication Data

US 2004/0106064 A1    Jun. 3, 2004

(30) Foreign Application Priority Data

Nov. 14, 2002    (KR)    ............... 10-2002-0070867

(51) Int. Cl.
| | |
|---|---|
| G03C 1/73 | (2006.01) |
| G03F 7/038 | (2006.01) |
| G03F 7/30 | (2006.01) |
| G03F 7/36 | (2006.01) |
| G03F 7/38 | (2006.01) |
| C08F 30/08 | (2006.01) |

(52) U.S. Cl. .............. 430/270.1; 430/910; 430/325; 430/280.1; 430/914; 430/316; 430/330; 430/327; 430/313; 430/328; 430/311; 430/945; 430/921; 430/925; 526/279

(58) Field of Classification Search .......... 526/279; 430/270.1, 325, 914, 905, 910, 280.1, 921, 430/925, 327, 328, 313, 316, 945
See application file for complete search history.

(56) References Cited

U.S. PATENT DOCUMENTS 4,551,417 A * 11/1985 Suzuki et al. ............ 430/316

(Continued)

FOREIGN PATENT DOCUMENTS

JP            10-142987    *    5/1998

OTHER PUBLICATIONS

Chem. Abstract—English abstract for JP 10-142987 (Yamaki et al).*
Machine-Assisted, partial English translation of JP 10-142987 (Yamaki et al).*

(Continued)

Primary Examiner—Sin Lee
(74) Attorney, Agent, or Firm—F. Chau & Associates, LLC

(57) ABSTRACT

A polymer used for a negative type resist composition having a first repeating unit of a Si-containing monomer unit, a second repeating unit having a hydroxy group or an epoxy ring and copolymerized with the first repeating unit is provided. The first repeating unit is represented by the following formula:

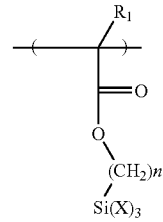

wherein $R_1$ is a hydrogen atom or a methyl group, X is a $C_1$–$C_4$ alkyl or alkoxy group, and n is an integer from 2 to 4. Also, there is provided a negative type resist composition including the polymer which is an alkali soluble base polymer, a photoacid generator and a crosslinking agent cross linkable in the presence of an acid.

58 Claims, 2 Drawing Sheets

U.S. PATENT DOCUMENTS

| | | | | |
|---|---|---|---|---|
| 5,314,961 A | * | 5/1994 | Anton et al. | 525/280 |
| 5,674,941 A | * | 10/1997 | Cho et al. | 525/102 |
| 2004/0009436 A1 | * | 1/2004 | Lee et al. | 430/313 |
| 2004/0197698 A1 | * | 10/2004 | Tamaki et al. | 430/270.1 |

OTHER PUBLICATIONS

Full, formal English translation of JP 10-142987 (Yamaki et al), provided by PTO.*

* cited by examiner

SILICON-CONTAINING POLYMER, NEGATIVE TYPE RESIST COMPOSITION COMPRISING THE SAME, AND PATTERNING METHOD FOR SEMICONDUCTOR DEVICE USING THE SAME

BACKGROUND

1. Technical Field

The present invention relates generally to silicon-containing polymers, negative type resist compositions comprising the same, and a patterning method for semiconductor devices using the same. More particularly, the present invention relates to silicon-containing polymers for use in a bi-layer resist (BLR) process, negative type resist compositions comprising the same, and a patterning method for semiconductor devices using the same.

2. Discussion of the Related Art

As semiconductor devices become more highly integrated and complex, the ability to form ultra-fine patterns becomes more important. For instance, in semiconductor devices of 1-Gigabit or greater, a pattern size having a design rule of 0.2 μm or less is needed. Such pattern size is difficult to achieve using conventional lithography processes using lower wavelength devices, e.g., a KrF eximer laser (248 nm), with a conventional resist material. Lithography processes using different exposure light sources, e.g., ArF excimer laser (193 nm) or $F_2$ excimer laser (157 nm), have been proposed.

Further, conventional ArF or $F_2$ resist materials suffer from a variety of drawbacks due to their structural limitation. One problem is the increase in the occurrence of patterns collapsing as the aspect ratio of pattern features increases. Another problem is the weak resistance against a dry etching process. Accordingly, there is an increasing demand for the development of new resist materials and processes.

In photolithography for the manufacture of highly integrated semiconductor devices, a single layer resist (SLR) process and a bi-layer resist (BLR) process are widely used. Use of the BLR process overcomes problems associated with the SLR process. For example, the BLR process increases the resistance to dry etching. Therefore, patterns having large aspect ratios can be formed using the BLR process and high resolution power can be provided at short-wavelength regions.

Generally, a BLR process requires a two component chemically amplified resist comprising a silicon-containing polymer having a silicon atom substituted in the backbone of the polymer and a photoacid generator (PAG), which is a positive type chemically amplified resist. Also, high-sensitivity resist materials suitable for the BLR process developed to be compatible with short-wavelength light sources are mostly positive type chemically amplified resists.

Although positive type chemically amplified resists are preferred in view of their higher resolution, compositions synthesized from the positive type chemically amplified resists suitable for the BLR process are too hydrophobic. Thus, adhesion to underlying layer materials is weak, and it is difficult to control the amount of silicon needed to create suitable resist materials. In particular, the most serious problem with the positive type chemically amplified resists is shrinkage by e-beam. In other words, while observing sizes of resist patterns using a scanning electron microscope (SEM), critical dimensions (CDs) of the patterns may change.

In pursuit of high-speed, highly-efficient DRAMs, there is a limitation in using positive type resists for forming isolated patterns. In lithography processes for the manufacture of semiconductor devices having a memory capacity of 1-Gigabit or more, use of phase shift masks is needed. In the design of phase shift masks, negative type resists are preferred over positive type resists.

Therefore, there is a need to develop negative type resists having a high transmittance to short-wavelength exposure light sources, high resolution power, and high dry etching resistance.

SUMMARY OF THE INVENTION

Provided is a polymer having a high transmittance at short-wavelengths and a high dry etching resistance for the manufacture of negative type resist compositions for forming fine patterns in a highly integrated semiconductor device.

Also provided is a negative type resist composition that can be used in conjunction with KrF eximer laser (248 nm), ArF excimer laser (193 nm) and next-generation $F_2$ excimer laser (157 nm), which also provides high dry etching resistance by including silicon and can be advantageously used in a BLR process to realize high resolution power and large aspect ratios.

Further, provided is a patterning method for a semiconductor device, by which fine patterns having large aspect ratios can be formed in highly integrated semiconductor devices.

According to one aspect of the present invention, there is provided a polymer used for a negative type resist composition, represented by the following formula:

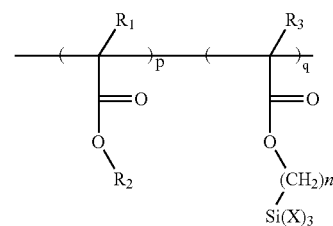

wherein $R_1$ is a hydrogen atom or methyl group, $R_2$ is a $C_2$–$C_8$ alkyl group having a hydroxy group, $R_3$ is a hydrogen atom or methyl group, X is a $C_1$–$C_4$ alkyl or alkoxy group, n is an integer from 2 to 4, and q/(p+q) is about 0.1 to about 0.5. And, the weight average molecular weight of the polymer is about 3,000 to about 50,000.

Preferably, $R_2$ is a 2-hydroxyethyl or a 2-hydroxypropyl group and X is a methyl group or a trimethylsilyloxy group. Further, the polymer may also include at least one repeating unit selected from the group consisting of acrylate derivatives, methacrylate derivatives, norbornene derivatives, maleic anhydride monomer derivatives and styrene derivatives, and the Si-containing repeating unit is contained in the base polymer in an amount of about 5 to about 40 mol % based on total number of moles of repeating units forming the base polymer.

In another aspect of the present invention, there is provided a polymer used for a negative type resist composition, represented by the following formula:

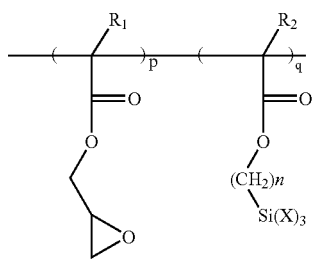

wherein $R_1$ is a hydrogen atom or a methyl group, $R_2$ is a hydrogen atom or methyl group, X is a $C_1$–$C_4$ alkyl or alkoxy group, n is an integer from 2 to 4, and q/(p+q) is about 0.1 to about 0.5. And, the weight average molecular weight of the polymer is about 3,000 to about 50,000.

Preferably, X is a methyl group or a trimethylsilyloxy group. Further, the polymer may also include at least one repeating unit selected from the group consisting of acrylate derivatives, methacrylate derivatives, norbornene derivatives, maleic anhydride monomer derivatives and styrene derivatives, and wherein the Si-containing repeating unit is contained in the base polymer in an amount of about 5 to about 40 mol % based on total number of moles of repeating units forming the base polymer.

According to still another aspect of the present invention, there is provided a negative type resist composition comprising:

(a) an alkali soluble base polymer having a first repeating unit represented by the following formula:

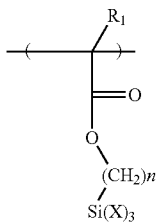

wherein $R_1$ is a hydrogen atom or methyl group, X is a $C_1$–$C_4$ alkyl or alkoxy group, and n is an integer from 2 to 4, a photoacid generator (PAG), and a crosslinking agent cross linkable in the presence of an acid. Further, the base polymer has a weight average molecular weight of about 3,000 to about 50,000.

According to yet another aspect of the present invention, there is provided a patterning method for a semiconductor device comprising forming a first resist layer on a layer to be etched on a semiconductor substrate, forming a second resist layer by coating a negative type resist composition comprising an alkali soluble base polymer, pre-baking the second resist layer, exposing the second resist layer to light, performing post-exposure baking (PEB) on the exposed second resist layer, forming a second resist layer pattern by developing the exposed second resist layer, forming a first resist layer pattern by etching the first resist layer using the second resist layer pattern as an etching mask, and etching the layer to be etched using the first resist layer pattern as an etching mask.

Further, the negative type resist composition comprising an alkali soluble base polymer may be represented by the following formula:

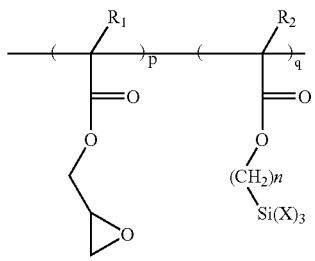

wherein $R_1$ is a hydrogen atom or a methyl group, $R_2$ is a hydrogen atom or methyl group, X is a $C_1$–$C_4$ alkyl or alkoxy group, n is an integer from 2 to 4, and q/(p+q) is about 0.1 to about 0.5, a photoacid generator (PAG), and a crosslinking agent formed of a compound having a hydroxy group and cross linkable by reacting with an acid.

Thus, a polymer, a negative type photoresist, and a patterning method for semiconductor devices using the same to solve the problems of the conventional art are disclosed.

DETAILED DESCRIPTION OF PREFERRED EMBODIMENTS

Figure 1:
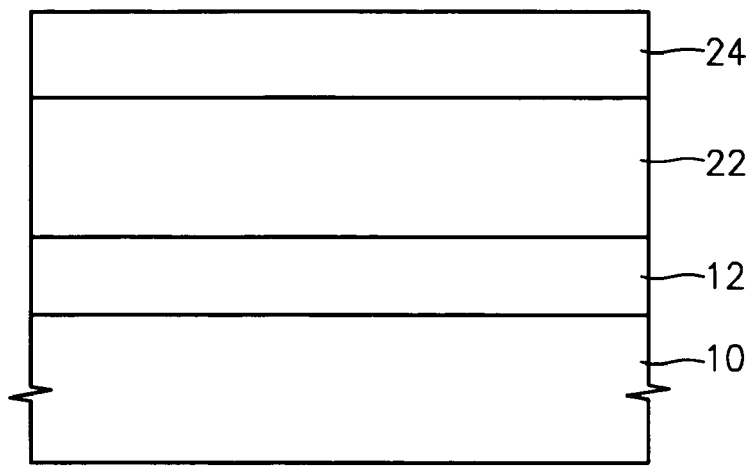
FIGS. 1 through 4 are cross-sectional views of a patterning method for semiconductor devices, according to an exemplary embodiment of the present invention.

The Embodiments of the present invention will now be described more fully hereinafter with reference to the accompanying drawings where applicable, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

A negative type resist composition according to an exemplary embodiment of the present invention includes an alkali soluble base polymer having a repeating unit formed of a Si-containing monomer unit, a photoacid generator (PAG) and a crosslinking agent cross linkable by reacting with an acid.

The base polymer comprises a first repeating unit represented by Formula 1:

<Formula 1>

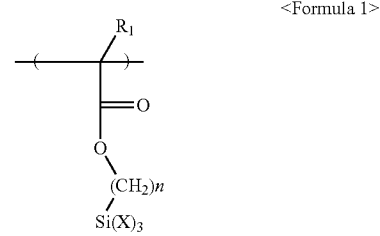

wherein $R_1$ is a hydrogen atom or a methyl group, X is a $C_1$–$C_4$ alkyl or alkoxy group, and n is an integer from 2 to 4. The base polymer has a weight average molecular weight of about 3,000 to about 50,000.

Preferably, X is a methyl group or a trimethylsilyloxy group.

The base polymer may further include a second repeating unit having a hydroxy group represented by Formula 2:

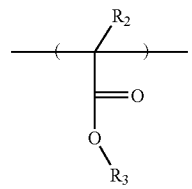

<Formula 2> wherein $R_2$ is a hydrogen atom or a methyl group, $R_3$ is a $C_2$–$C_8$ alkyl group having a hydroxy group. Preferably, $R_3$ is a 2-hydroxyethyl or a 2-hydroxypropyl group.

If the base polymer includes a Si-containing first repeating unit represented by Formula 1 and a second repeating unit having a hydroxy group represented by Formula 2, the structure of the base polymer can be represented by Formula 3:

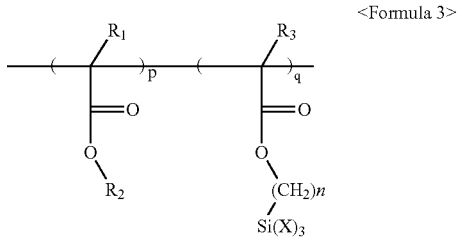

<Formula 3> wherein $R_1$ is a hydrogen atom or a methyl group, $R_2$ is a $C_2$–$C_8$ alkyl group having a hydroxy group, $R_3$ is a hydrogen atom or a methyl group, X is a $C_1$–$C_4$ alkyl or alkoxy group, n is an integer from 2 to 4, and $q/(p+q)$ is about 0.1 to about 0.5. Preferably, $R_2$ is a 2-hydroxyethyl group or a 2-hydroxypropyl group.

In the case of using the base polymer represented by Formula 3, a negative type resist composition can be manufactured using a compound having an epoxy ring as a crosslinking agent. In the manufacture of the negative type resist composition, aliphatic compounds having multi-epoxy groups can be used as the crosslinking agent having an epoxy ring. These aliphatic compounds cause curing with a hydroxy group in the presence of an acid.

Preferably, the crosslinking agent having an epoxy ring is a triglycidyl isocyanurate, a trimethylolpropane triglycidyl ether, or a triphenylolmethane triglycidyl ether.

The base polymer represented by Formula 3 may further include a third repeating unit selected from the group consisting of acrylate derivatives, methacrylate derivatives, norbornene derivatives, maleic anhydride monomer derivatives, and styrene derivatives. Preferably, the Si-containing repeating unit is contained in the base polymer in an amount of about 5 to about 40 mol % based on total number of moles of repeating units forming the base polymer.

The second repeating unit may be a repeating unit having an epoxy ring represented by the following Formula 4:

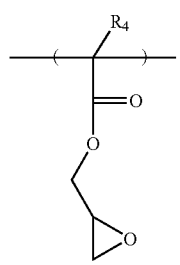

<Formula 4> wherein $R_4$ is a hydrogen atom or a methyl group.

If the base polymer includes a Si-containing first repeating unit represented by Formula 1 and a second repeating unit having an epoxy ring represented by Formula 4, the structure of the base polymer can be represented by Formula 5:

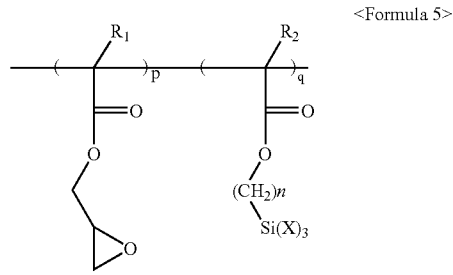

<Formula 5> wherein $R_1$ is a hydrogen atom or a methyl group, $R_2$ is a hydrogen atom or a methyl group, X is a $C_1$–$C_4$ alkyl or alkoxy group, n is an integer from 2 to 4, and $q/(p+q)$ is about 0.1 to about 0.5.

In the case of using the base polymer represented by Formula 5, a negative type resist composition can be manufactured using a compound having a hydroxy group as a crosslinking agent, according to another embodiment of the present invention. In the manufacture of the negative type resist composition, the crosslinking agent having a hydroxy group used for causing curing with an expoxy ring in the base polymer may be a polymer having three or more different monomer units. In addition, the crosslinking agent may be a low molecular weight aliphatic compound having a multi-hydroxy group, and the low-molecule weight aliphatic compound may cause curing with an epoxy group in the presence of an acid.

Preferably, the crosslinking agent having a hydroxy group is 1,3,5-tris(2-hydroxyethyl)cyanuric acid, 1,1,1-tris(hydroxymethyl)ethane, triethylene glycol, diethylene glycol, 1,2,6-trihydroxyhexane or trimethylolpropane.

The base polymer represented by Formula 5 may further include a third repeating unit selected from a group consisting of acrylate derivatives, methacrylate derivatives, norbornene derivatives, maleic anhydride monomer derivatives and styrene derivatives. Preferably, the Si-containing repeating unit is contained in the base polymer in an amount of about 5 to about 40 mol % based on total number of moles of repeating units forming the base polymer. Preferably, the third repeating unit includes a (meth)acrylate derivative or norbornene derivative having a hydroxy group.

In the manufacture of the negative type resist composition according to another exemplary embodiment of the present invention, PAG is contained in an amount of about 1.0 to about 15% by weight based on the total weight of the base polymer. Preferably, PAG includes onium compounds exemplified by triarylsulfonium salts, diaryliodonium salts, or mixtures thereof. More preferably, the PAG comprises triphenylsulfonium triflate, diphenyliodonium triflate, di-t-butyldiphenyliodonium triflate, or mixtures thereof.

According to another embodiment of the present invention, a negative type resist composition may further comprise an organic base in an amount of about 0.01 to about 2.0 wt % on the basis of the total weight of the base polymer. Preferably, the organic base comprises organic tertiary amine compounds exemplified by triethylamine, triisobutylamine, trioctylamine, triisodecylamine, triethanolamine, or mixtures thereof.

FIGS. 1 through 4 are cross-sectional views of a patterning method for a semiconductor device according to the present invention.

First, referring to FIG. 1, an etching target layer 12 is formed on a substrate 10, for example, a semiconductor substrate or a transparent, and a BLR structure resist layer comprised of a first resist layer 22 and a second resist layer 24 containing silicon is formed by spin coating. The second resist layer 24 is a negative type resist composition according to the embodiments of the present invention discussed above. After the negative type resist composition is spin coated on the first resist layer 22, pre-baking is performed to provide the second resist layer 24 having a predetermined thickness. Preferably, the predetermined thickness of the second resist layer 24 is about 100 to about 400 nm.

Figure 2:
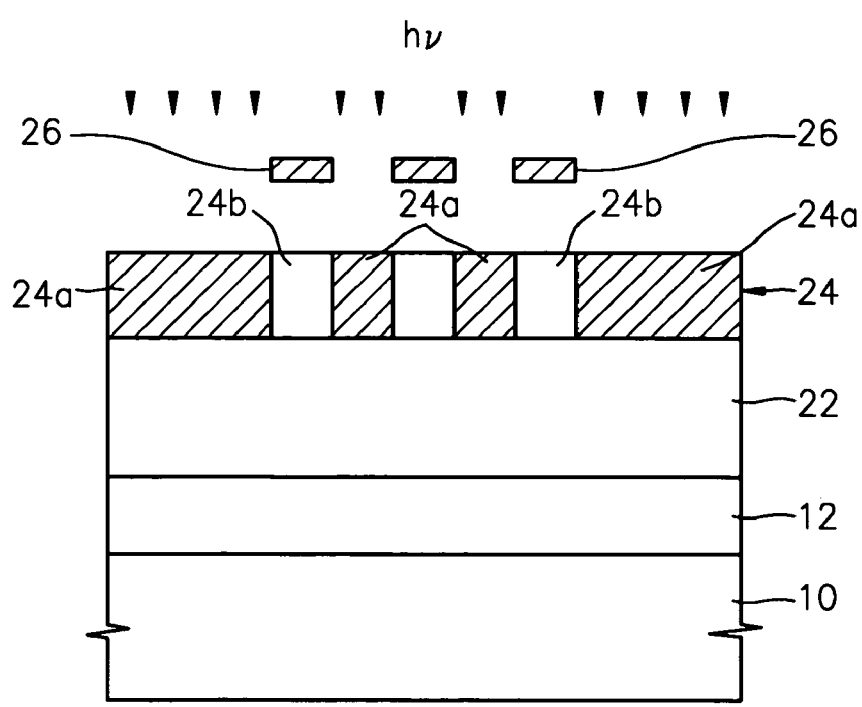

Referring to FIG. 2, a selected portion of the second resist layer 24 is exposed to light through a mask 26 using a KrF, ArF or $F_2$ eximer laser. Thus, the second resist layer 24 is defined by an exposure portion 24a and a non-exposure portion 24b. Then, a post exposure bake (PEB) is performed on the exposed second resist layer 24. And, cross-linkage occurs at the exposure portion 24a of the second resist layer 24 with the PAG.

Figure 3:
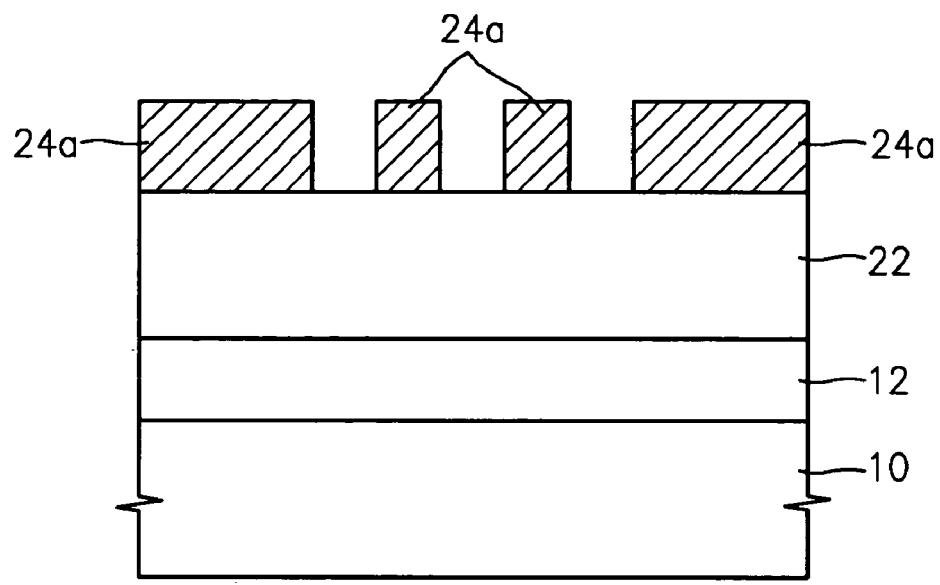

Referring to FIG. 3, the exposed second resist layer 24 is developed using an alkali solution, e.g., a tetramethylammonium hydroxide (TMAH) solution, to remove the non-exposure portion 24b, thereby forming a second resist layer pattern 24a formed of the exposure portion 24a, which is a negative type pattern.

Figure 4:
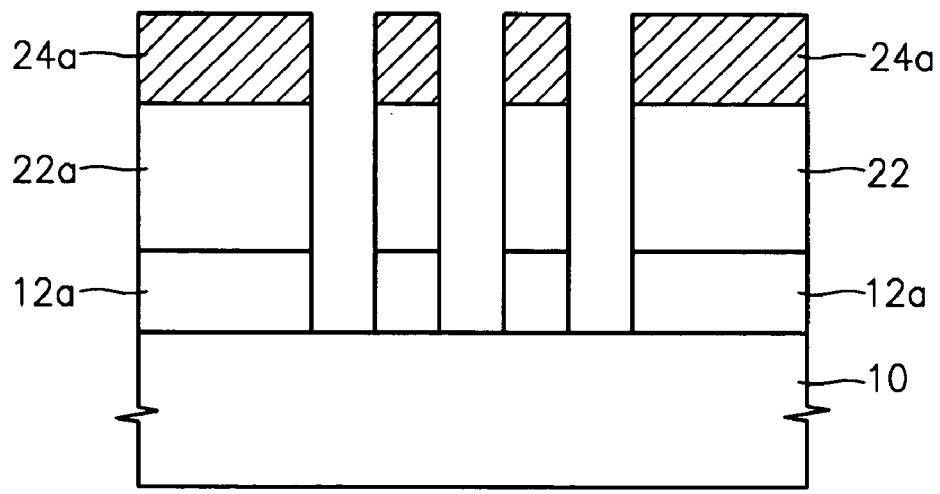

Referring to FIG. 4, the first resist layer 22 is etched, e.g., using $O_2$ plasma, using the second resist layer pattern 24a as an etching mask to form a first resist layer pattern 22a. Subsequently, the etching target layer 12 is etched using the first resist layer pattern 22a as an etching mask to form an etching target layer pattern 12a.

The present invention will now be described in more detail with reference to the following illustrative examples. Further, the following illustrative examples may be altered in various forms and the invention should not be construed as limited thereto.

EXAMPLE 1

Synthesis of Polymer

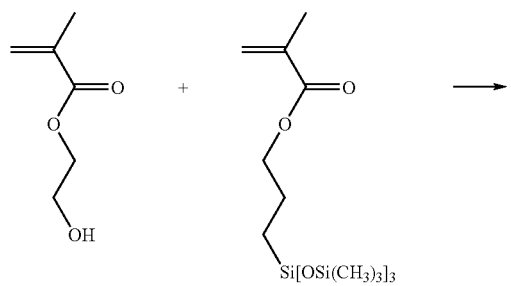

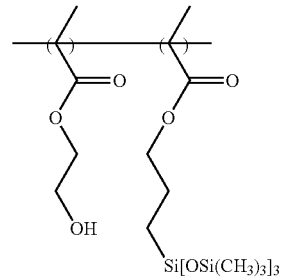

4.3 g of 3-[tris(trimethylsilyloxy)silyl]propyl methacrylate (10 mmol) and 3.9 g of 2-hydroxyethyl methacrylate (30 mmol) were dissolved in a round bottom flask containing 35 g of tetrahydrofuran (THF) and 0.33 g of azobisisobutyronitrile (AIBN) (5 mol %) and purged using nitrogen, followed by polymerizing at about 65° C. for about 12 hours.

After polymerization, the reactant was slowly precipitated with excess n-hexane. Thereafter, the precipitate was filtered, and the filtrate was dissolved in an appropriate amount of THF and re-precipitated in n-hexane. Then, the obtained precipitate was dried in a vacuum oven at about 50° C. for about 24 hours, giving a desired product at a yield of about 75%.

The obtained product had a weight average molecular weight (Mw) of about 13,200 and polydispersity (Mw/Mn) of about 1.9.

EXAMPLE 2

Synthesis of Polymer

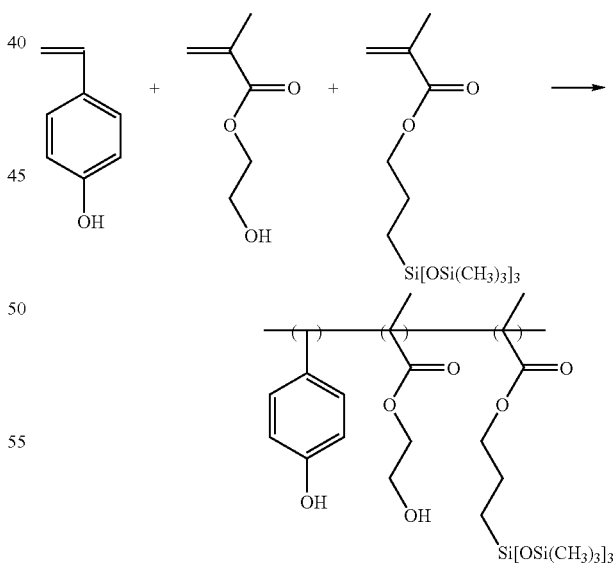

1.8 g of 4-hydroxystyrene (15 mmol), 2.0 g of 2-hydroxyethyl methacrylate (15 mmol), and 4.3 g of 3-[tris(trimethylsilyloxy)silyl]propyl methacrylate (10 mmol) were dissolved 30 g of THF and 0.33 g of AIBN (5 mol %), followed by polymerizing, thereby synthesizing a desired polymer at a yield of about 70%.

The obtained product had a weight average molecular weight (Mw) of about 12,100 and polydispersity (Mw/Mn) of about 2.0.

EXAMPLE 3

Synthesis of Polymer

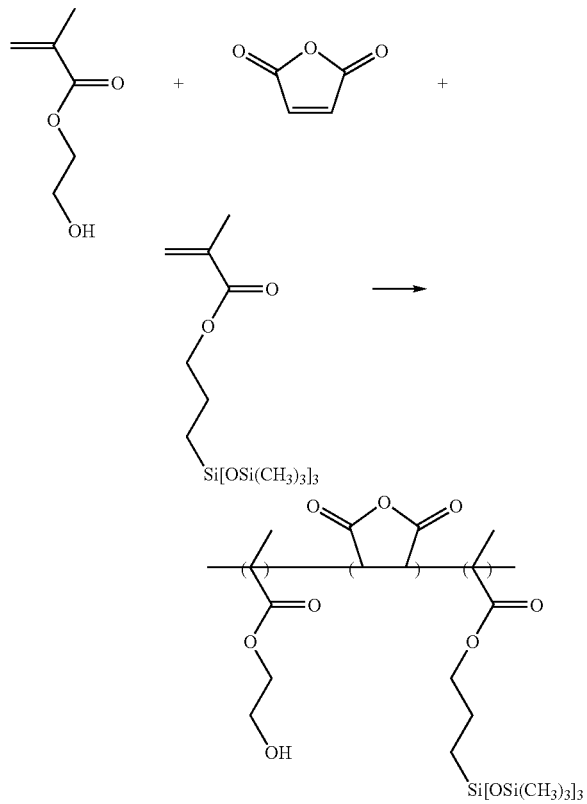

2.6 g of 2-hydroxyethyl methacrylate (20 mmol), 2.95 g of maleic anhydride (30 mmol) and 4.3 g of 3-[tris(trimethylsilyloxy)silyl]propyl methacrylate (10 mmol) were dissolved in 20 g of THF and 0.20 g of AIBN (2 mol %), followed by polymerizing, thereby synthesizing a desired polymer at a yield of about 50%.

The obtained product had a weight average molecular weight (Mw) of about 9,700 and polydispersity (Mw/Mn) of about 1.9.

EXAMPLE 4

Synthesis of Polymer

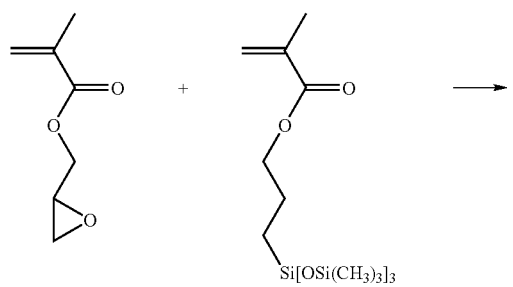

-continued 4.3 g of 3-[tris(trimethylsilyloxy)silyl]propyl methacrylate (10 mmol) and 5.7 g of glycidyl methacrylate (40 mmol) were dissolved in a round bottom flask containing 40 g of THF and 0.41 g of AIBN (5 mol %) and purged using nitrogen, followed by polymerizing at about 65° C. for about 12 hours.

After polymerization, the reactant was slowly precipitated with excess n-hexane. Thereafter, the precipitate was filtered, and the filtrate was dissolved in an appropriate amount of THF and re-precipitated in n-hexane. Then, the obtained precipitate was dried in a vacuum oven at about 50° C. for about 24 hours, giving a desired product at a yield of about 75%.

The obtained product had a weight average molecular weight (Mw) of about 13,500 and polydispersity (Mw/Mn) of about 2.0.

EXAMPLE 5

Synthesis of Polymer

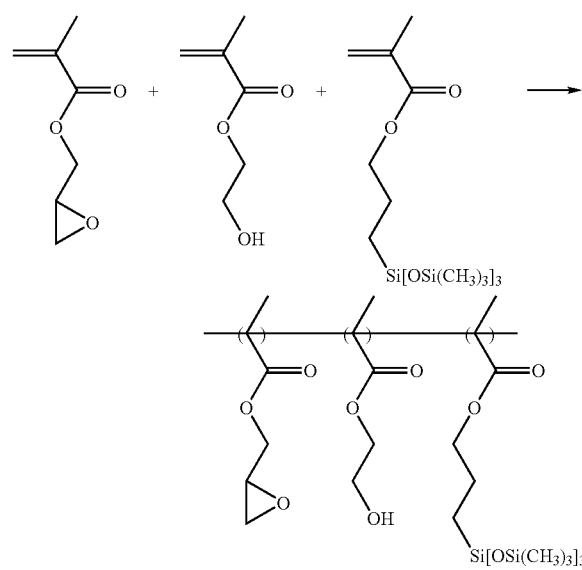

2.2 g of glycidyl methacrylate (15 mmol), 2.0 g of 2-hydroxyethyl methacrylate (15 mmol) and 4.3 g of 3-[tris(trimethylsilyloxy)silyl]propyl methacrylate (10 mmol) were dissolved in 30 g of THF and 0.33 g of AIBN (5 mol %), followed by polymerizing in the same manner as in Example 4, thereby synthesizing a desired polymer at a yield of about 70%.

The obtained product had a weight average molecular weight (Mw) of about 14,100 and polydispersity (Mw/Mn) of about 2.0.

EXAMPLE 6

Synthesis of Polymer

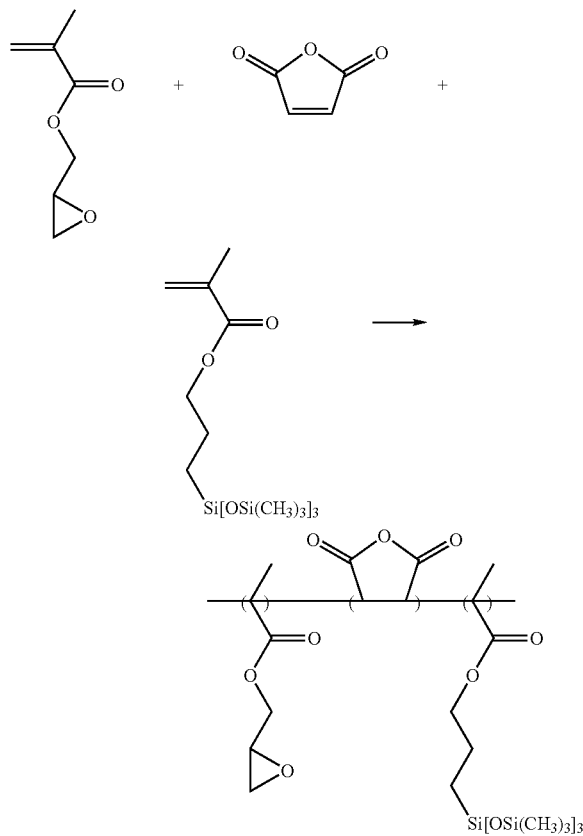

4.4 g of glycidyl methacrylate (30 mmol), 3.95 g of maleic anhydride (40 mmol) and 4.3 g of 3-[tris(trimethylsilyloxy)silyl]propyl methacrylate (10 mmol) were dissolved in 25 g of THF together with 0.26 g of AIBN (2 mol %), followed by polymerizing in the same manner as in Example 1, thereby synthesizing a desired polymer at a yield of about 50%.

The obtained product had a weight average molecular weight (Mw) of about 9,100 and polydispersity (Mw/Mn) of about 1.9.

EXAMPLE 7

Preparation of Resist Compositions and Lithographic Performance

Using polymers synthesized in Examples 1 through 3 as base polymers, 1.0 g of each polymer, 0.2 g of trimethylolpropane triglycidyl ether as a crosslinking agent, 0.02 g of triphenylsulfonium trifluoromethane sulfonate (triflate) as a PAG and 1 mg triisobutylamine as an organic base were completely dissolved in 10 g of propylene glycol monomethyl ether acetate (PGMEA) and then filtered using a 0.2 μm membrane filter, thereby forming each resist solution. The filtered solution was then coated to a thickness of about 0.25 μm on a bare silicon (Si) wafer treated with hexamethyldisilazane (HMDS), a pre-bake (or soft-bake) was performed at about 120° C. for about 90 seconds and exposed to light using an ArF stepper (0.6 NA, σ=0.75).

Then, a post exposure bake (PEB) was performed at a temperature of about 120° C. for about 60 seconds. The resultant was developed using a solution of 2.38 wt % tetramethylammonium hydroxide (TMAH) for about 60 seconds. Thus, a 150 nm line-and-space pattern was obtained at an exposure dose of about 11 to about 15 mJ/cm$^2$.

EXAMPLE 8

Preparation of Resist Compositions and Lithographic Performance

Using polymers synthesized in Examples 1 through 3 as base polymers, 1.0 g of each polymer, 0.2 g triglycidyl isocyanurate as a crosslinking agent and 0.02 g triphenylsulfonium trifluoromethane sulfonate (triflate) as a PAG were completely dissolved in 10 g PGMEA and then filtered using a 0.2 μm membrane filter, thereby forming each resist solution. The filtered solution was coated to a thickness of about 0.25 μm on a bare silicon (Si) wafer treated with HMDS, a soft-bake was performed at about 120° C. for about 90 seconds, and then exposed to light using an ArF stepper (0.6 NA, σ=0.75).

Next, a PEB was performed at a temperature of about 120° C. for about 60 seconds. The resultant was developed using a solution of TMAH (2.38 wt %) for about 60 seconds. Thus, a 150 nm line-and-space pattern was obtained at an exposure dose of about 10 to about 16 mJ/cm$^2$.

EXAMPLE 9

Preparation of Resist Composition and Lithographic Performance 1.0 g of each of the respective polymers synthesized in Examples 4 and 6 as a base polymer, 0.2 g of 1,3,5-tris(2-hydroxyethyl)cyanuric acid as a crosslinking agent and 0.02 g of triphenylsulfonium triflate as a PAG were completely dissolved in 10.0 g of propylene glycol monomethyl ether acetate (PGMEA) and then filtered using a 0.2 μm membrane filter, thereby forming each resist solution.

A resist solution was then coated to a thickness of about 0.25 μm on a silicon (Si) wafer treated with HMDS, and pre-baked at about 120° C. for about 90 seconds, followed by exposing to light using an ArF stepper (0.6NA, σ=0.75). Thereafter, a post exposure bake (PEB) was performed at a temperature of about 120° C. for about 60 seconds.

The resultant was developed using a solution of TMAH (2.38 wt %) for about 60 seconds. Thus, a 150 nm line-and-space pattern was obtained at an exposure dose of about 11 to about 15 mJ/cm$^2$.

EXAMPLE 10

Preparation of Resist Composition and Lithographic Performance 1.0 g of a polymer synthesized in Example 5 as a base polymer, 0.2 g of 1,3,5-tris(2-hydroxyethyl)cyanuric acid as a crosslinking agent, triisobutylamine amine as an organic solvent and 0.02 g of triphenylsulfonium triflate as a PAG were completely dissolved in 10.0 g of propylene glycol monomethyl ether acetate (PGMEA) and then filtered using a 0.2 μm membrane filter, thereby forming a resist solution.

The resist solution was then coated to a thickness of about 0.25 μm on a silicon (Si) wafer treated with HMDS, and pre-baked at about 120° C. for about 90 seconds, followed by exposure to light using an ArF stepper (0.6NA, σ=0.75).

Thereafter, a post exposure bake (PEB) was performed at a temperature of about 120° C. for about 60 seconds. The resultant was developed using a solution of TMAH (2.38 wt %) for about 60 seconds. Thus, a 140 nm line-and-space pattern was obtained at an exposure dose of about 10 to about 16 mJ/cm$^2$.

EXAMPLE 11

BLR Patterning Process

A silicon nitride layer is formed on a Si wafer to a thickness of about 3000 Å and an i-line resist (such as ip3300 manufactured by Tokyo Ohka Kogyo Co.) was coated thereon to a thickness of about 500 nm, followed by thermally treating the Si wafer having the silicon nitride layer and i-line resist at a temperature of about 220° C., thereby forming a bottom layer.

The resist composition (Example 4) obtained from the polymer synthesized in Example 3 was coated on the bottom layer to a thickness of about 250 nm to form a top layer. Thereafter, a soft-bake was performed at about 120° C. for about 90 seconds. Then, an exposure process was performed using an ArF stepper (0.6NA, σ=0.75). Next, a post exposure bake (PEB) was performed at a temperature of about 120° C. for about 60 seconds. The resultant was then developed using a solution of TMAH (2.38 wt %) for about 60 seconds. Next, a post-development bake (PDB) was performed at about 110° C. for about 60 seconds to form a top layer pattern.

The bottom layer was etched by a dry etching process using O$_2$ plasma (source gases: O$_2$/SO$_2$) and the top layer pattern as an etching mask to form a bottom layer pattern. Thereafter, the top layer pattern was removed using a stripper.

Thereafter, a silicon nitride layer was etched by a dry etching process using a CF$_4$ plasma and the bottom layer pattern comprised of i-line resist as an etching mask, thereby forming a silicon nitride layer pattern. Then, the resist layer remaining on the wafer was removed using a stripper.

Although the present invention has been particularly shown and described with reference to specific embodiments thereof, the non-limiting embodiments described in the specification of the invention are illustrative only.

For example, in the manufacture of a negative type resist composition according to the present invention, the crosslinking agent is not limited to the compounds illustrated in the embodiments. For example, as in Examples 7 and 8, triglycidyl isocyanurate, trimethylolpropane triglycidyl ether or triphenylolmethane triglycidyl ether can also be used as a crosslinking agent. Also, as in Examples 9 and 10, 1,3,5-tris(2-hydroxyethyl)cyanuric acid, 1,1,1-tris(hydroxymethyl)ethane, triethylene glycol, diethylene glycol, 1,2,6-trihydroxyhexane, or trimethylolpropane can also be used as a crosslinking agent.

The PAG is used in an amount of about 1.0 to about 15% by weight based on the weight of the base polymer and examples thereof include triarylsulfonium salts, diaryliodonium salts and mixtures thereof. Also, the organic base is contained in an amount of about 0.01 to about 2.0 wt % on the basis of the total weight of the base polymer and comprises a tertiary amine exemplified by triethylamine, triisobutylamine, trioctylamine, triisodecylamine, diethanolamine, triethanolamine, or mixtures thereof.

In the patterning described in Examples 7 through 11, during coating, the thickness of the negative type resist composition coated on the wafer may vary according to use. Preferably, the thickness of the negative type resist composition is about 0.2 to about 0.7 μm. Soft-baking is generally performed at about 110 to about 140° C. for about 60 to about 90 seconds. During exposure, an exposure dose may vary according to a deep-UV used. In the case of using ArF or F$_2$ eximer laser, energy of about 5 to about 100 mJ/cm$^2$ is generally used. The PEB is generally performed at about 100 to about 130° C. for about 60 to about 90 seconds. The development is generally performed using a 2.38 wt % TMAH (0.26 N) solution for about 20 to about 60 seconds.

According to at least one embodiment of the present invention, a polymer comprising a first repeating unit having a Si-containing monomer unit is provided. The polymer further comprises a second repeating unit having a hydroxy group copolymerized with the first repeating unit. The second repeating unit may be a monomer unit having a hydroxy group or a monomer unit having an epoxy ring. The polymer having the above-described structure exhibits high transmittance at short wavelengths and provides high dry etching resistance by including silicon therein. Therefore, the polymer can be used for the manufacture of the negative type resist composition that is advantageously used in forming fine patterns.

Also, the negative type resist composition according to the present invention includes an alkali soluble base polymer having a repeating unit formed of a Si-containing monomer unit, a PAG and a crosslinking agent. If the base polymer includes a Si-containing monomer unit and a monomer unit having an epoxy ring, the crosslinking agent is formed of a compound having a hydroxy group. Therefore, in the case of using the negative type resist composition according to the embodiments of the present invention in a BLR process, the density of a resist layer is increased by cross-linkage. Therefore, shrinkage caused by e-beam, which is the most serious problem with conventional positive type chemically amplified resists, is prevented. Also, compared with the conventional positive type resist composition, a negative type resist composition according to the present invention has improved adhesion to underlying layers and easily adjustably wettability.

Further, the negative type resist composition according to the embodiments of the present invention exhibits high transmittance at short wavelengths such as a KrF (248 nm), ArF (193 nm), or F$_2$ (157 nm) eximer laser, and provides high dry etching resistance by including silicon therein. Therefore, the negative type resist composition can be advantageously used in a BLR process. Also, patterns having large aspect ratios, which are required for highly integrated semiconductor devices, can be formed using the BLR process in conjunction with the negative type resist compositions, according to the embodiments of the present invention.

While this invention has been particularly shown and described with reference to preferred embodiments thereof, it will be understood by those skilled in the art that various changes in form and details may be made therein without departing from the spirit and scope of the invention.

What is claimed is:

1. A polymer used for a negative type resist composition, represented by the following formula:

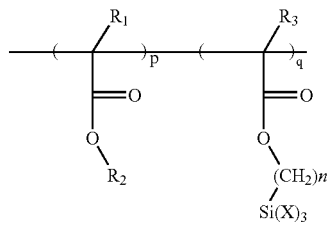

wherein $R_1$ is a hydrogen and a methyl group, $R_2$ is a $C_2$–$C_8$ alkyl group having a hydroxy group, $R_3$ is a hydrogen atom or methyl group, X is a methyl group or a trimethylsilyloxy group, n is an integer from 2 to 4, and q/(p+q) is about 0.1 to about 0.5.

2. The polymer of claim 1, wherein the weight average molecular weight of the polymer is about 3,000 to about 50,000.

3. The polymer of claim 1, wherein $R_2$ is a 2-hydroxyethyl or a 2-hydroxypropyl group.

4. The polymer of claim 1, further comprising at least one repeating unit selected from the group consisting of acrylate derivatives, methacrylate derivatives, norbornene derivatives, maleic anhydride monomer derivatives or styrene derivatives, and wherein the Si-containing repeating unit is contained in the base polymer in an amount of about 5 to about 40 mol % based on total number of moles of repeating units forming the base polymer.

5. A negative type resist composition comprising:
(a) an alkali soluble base polymer having a first repeating unit represented by the following formula:

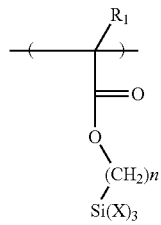

wherein $R_1$ is a hydrogen atom or a methyl group, X is a $C_1$–$C_4$ alkyl, alkoxy, or a trimethylsiyloxy group, and n is an integer from 2 to 4;
(b) a photoacid generator (PAG); and
(c) a crosslinking agent cross linkable by reacting with an acid.

6. The negative type resist composition of claim 5, wherein the base polymer has a weight average molecular weight of about 3,000 to about 50,000.

7. The negative type resist composition of claim 5, wherein the $C_1$–$C_a$ alkyl of X is a methyl group.

8. The negative type resist composition of claim 5, wherein the base polymer further comprises a second repeating unit having a hydroxy group.

9. The negative type resist composition of claim 8, wherein the second repeating unit is represented by the following formula:

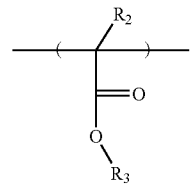

wherein $R_2$ is a hydrogen atom or a methyl group, and $R_3$ is a $C_2$–$C_8$ alkyl group having a hydroxy group.

10. The negative type resist composition of claim 9, wherein $R_3$ is a 2-hydroxyethyl or a 2-hydroxypropyl group.

11. The negative type resist composition of claim 9, wherein the base polymer further comprises at least one repeating unit selected from the group consisting of acrylate derivatives, methacrylate derivatives, norbornene derivatives, maleic anhydride monomer derivatives and styrene derivatives, and wherein the Si-containing repeating unit is contained in the base polymer in an amount of about 5 to about 40 mol % based on total number of moles of repeating units forming the base polymer.

12. The negative type resist composition of claim 8, wherein the crosslinking agent comprises a compound having an epoxy ring.

13. The negative type resist composition of claim 12, wherein the crosslinking agent comprises triglycidyl isocyanurate, trimethylolpropane triglycidyl ether or triphenylolmethane triglycidyl ether.

14. The negative type resist composition of claim 5, wherein the base polymer further comprises a second repeating unit having an epoxy ring.

15. The negative type resist composition of claim 14, wherein the second repeating unit is represented by the following formula:

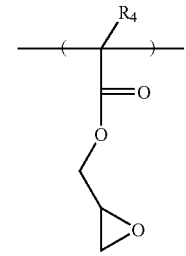

wherein $R_4$ is a hydrogen atom or a methyl group.

16. The negative type resist composition of claim 15, wherein the base polymer further comprises a third repeating unit selected from the group consisting of acrylate derivatives, methacrylate derivatives, norbornene derivatives, maleic anhydride monomer derivatives and styrene derivatives, and wherein the Si-containing repeating unit is contained in the base polymer in an amount of about 5 to about 40 mol % based on total number of moles of repeating units forming the base polymer.

17. The negative type resist composition of claim 16, wherein the third repeating unit is a (meth)acrylate derivative or norbornene derivative having a hydroxy group.

18. The negative type resist composition of claim 14, wherein the crosslinking agent comprises a compound having a hydroxy group.

19. The negative type resist composition of claim 18, wherein the crosslinking agent comprises 1,3,5-tris(2-hydroxyethyl)cyanuric acid, 1,1,1-tris(hydroxymethyl)ethane, triethylene glycol, diethylene glycol, 1,2,6-trihydroxyhexane or trimethylolpropane.

20. The negative type resist composition of claim 5, wherein the PAG is contained in an amount of about 1.0 to about 15% by weight based on the total weight of the base polymer.

21. The negative type resist composition of claim 5, wherein the PAG comprises triarylsulfonium salts, diaryliodonium salts, or mixtures thereof.

22. The negative type resist composition of claim 21, wherein the PAG comprises triphenylsulfonium triflate, diphenyliodonium triflate, di-t-butyldiphenyliodonium triflate, or mixtures thereof.

23. The negative type resist composition of claim 5, further comprising an organic base.

24. The negative type resist composition of claim 23, wherein the organic base is contained in an amount of about 0.01 to about 2.0 wt % on the basis of the total weight of the base polymer.

25. The negative type resist composition of claim 23, wherein the organic base comprises triethylamine, triisobutylamine, trioctylamine, triisodecylamine, triethanolamine, or mixtures thereof.

26. A negative type resist composition comprising:
    (a) an alkali soluble base polymer represented by the following formula:

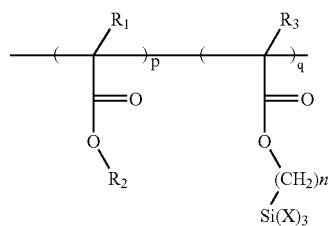

wherein $R_1$ is a hydrogen atom or a methyl group, $R_2$ is a $C_2$–$C_8$ alkyl group, $R_3$ is a hydrogen atom or a methyl group, X is a $C_1$–$C_4$ alkyl, alkoxy, or a trimethylsilyloxy group, n is an integer from 2 to 4 and $q/(p \cong q)$ is about 0.1 to about 0.5;
    (b) a photoacid generator (PAG); and
    (c) a crosslinking agent formed of a compound having an epoxy ring and cross linkable by reacting with an acid.

27. The negative type resist composition of claim 26, wherein the base polymer has a weight average molecular weight of about 3,000 to about 50,000.

28. The negative type resist composition of claim 26, wherein $R_2$ is a 2-hydroxyethyl or a 2-hydroxypropyl group.

29. The negative type resist composition of claim 26, wherein the $C_1$–$C_4$ alkyl of X is a methyl group.

30. The negative type resist composition of claim 26, wherein the crosslinking agent comprises triglycidyl isocyanurate, trimethylolpropane triglycidyl ether or triphenylolmethane triglycidyl ether.

31. The negative type resist composition of claim 26, wherein the base polymer further comprises a repeating unit selected from the group consisting of acrylate derivatives, methacrylate derivatives, norbornene derivatives, maleic anhydride monomer derivatives and styrene derivatives, and wherein the Si-containing repeating unit is contained in the base polymer in an amount of about 5 to about 40 mol % based on total number of moles of repeating units forming the base polymer.

32. The negative type resist composition of claim 26, wherein the PAG is contained in an amount of about 1.0 to about 15% by weight based on the total weight of the base polymer.

33. The negative type resist composition of claim 26, wherein the PAG comprises triarylsulfonium salts, diaryliodonium salts, or mixtures thereof.

34. The negative type resist composition of claim 33, wherein the PAG comprises triphenylsulfonium triflate, diphenyliodonium triflate, di-t-butyldiphenyliodonium triflate, or mixtures thereof.

35. The negative type resist composition of claim 26, further comprising an organic base.

36. The negative type resist composition of claim 35, wherein the organic base is contained in an amount of about 0.01 to about 2.0 wt % on the basis of the total weight of the base polymer.

37. The negative type resist composition of claim 35, wherein the organic base comprises triethylamine, triisobutylamine, trioctylamine, triisodecylamine, triethanolamine, or mixtures thereof.

38. A negative type resist composition comprising:
    (a) an alkali soluble base polymer represented by the following formula:

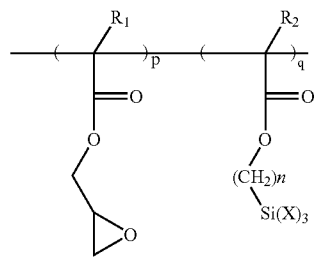

wherein $R_1$ is a hydrogen atom or a methyl group, $R_2$ is a hydrogen atom or a methyl group, X is a $C_1$–$C_4$ alkyl, alkoxy, or trimethylsilyloxy group, n is an integer from 2 to 4, and $q/(p \cong q)$ is about 0.1 to about 0.5;
    (b) a photoacid generator (PAG); and
    (c) a crosslinking agent formed of a compound having a hydroxy group and cross linkable by reacting with an acid.

39. The negative type resist composition of claim 38, wherein the base polymer has a weight average molecular weight of about 3,000 to about 50,000.

40. The negative type resist composition of claim 38, wherein the $C_1$–$C_4$ alkyl of X is a methyl group.

41. The negative type resist composition of claim 38, wherein the crosslinking agent comprises 1,3,5-tris(2-hydroxyethyl) cyanuric acid, 1,1,1-tris(hydroxymethyl)ethane, triethylene glycol, diethylene glycol, 1,2,6-trihydroxyhexane or trimethylolpropane.

42. The negative type resist composition of claim 38, wherein the base polymer further comprises a repeating unit selected from the group consisting of acrylate derivatives, methacrylate derivatives, norbornene derivatives, maleic anhydride monomer derivatives and styrene derivatives, and wherein the Si-containing repeating unit is contained in the base polymer in an amount of about 5 to about 35 mol % based on total number of moles of repeating units forming the base polymer.

43. The negative type resist composition of claim 42, wherein the base polymer further comprises a repeating unit of a (meth)acrylate derivative or norbornene derivative having a hydroxy group.

44. The negative type resist composition of claim 38, wherein the PAG is contained in an amount of about 1.0 to about 15% by weight based on the total weight of the base polymer.

45. The negative type resist composition of claim 38, wherein the PAG comprises triarylsulfonium salts, diaryliodonium salts, or mixtures thereof.

46. The negative type resist composition of claim 45, wherein the PAG comprises triphenylsulfonium triflate, diphenyliodonium triflate, di-t-butyldiphenyliodonium triflate, or mixtures thereof.

47. The negative type resist composition of claim 38, further comprising an organic base.

48. The negative type resist composition of claim 47, wherein the organic base is contained in an amount of about 0.01 to about 2.0 wt % on the basis of the total weight of the base polymer.

49. The negative type resist composition of claim 47, wherein the organic base comprises triethylamine, triisobutylamine, trioctylamine, triisodecylamine, triethanolamine, or mixtures thereof.

50. A patterning method for a semiconductor device comprising:
(a) forming a first resist layer on a layer to be etched on a semiconductor substrate;
(b) forming a second resist layer by coating a negative type resist composition comprising an alkali soluble base polymer represented by the following formula:

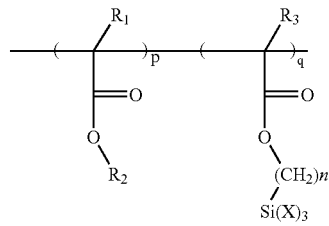

wherein $R_1$ is a hydrogen atom or a methyl group, $R_2$ is a $C_2$–$C_8$ alkyl group, $R_3$ is a hydrogen atom or a methyl group, X is a $C_1$–$C_4$ alkyl, alkoxy, or methylsilyloxy group, n is an integer from 2 to 4 and $q/(p\cong q)$ is about 0.1 to about 0.5, a photoacid generator (PAG), and a crosslinking agent formed of a compound having an epoxy ring and cross linkable by reacting with an acid;
(c) pre-baking the second resist layer;
(d) exposing the second resist layer to light;
(e) performing post-exposure baking (PEB) on the exposed second resist layer;
(f) forming a second resist layer pattern by developing the exposed second resist layer;
(g) forming a first resist layer pattern by etching the first resist layer using the second resist layer pattern as an etching mask; and
(h) etching the layer to be etched using the first resist layer pattern as an etching mask.

51. The patterning method of claim 50, wherein $R_2$ is a 2-hydroxyethyl or a 2-hydroxypropyl group.

52. The patterning method of claim 50, wherein the $C_1$–$C_4$ alkyl of X is a methyl group.

53. The patterning method of claim 50, wherein the crosslinking agent comprises triglycidyl isocyanurate, trimethylolpropane triglycidyl ether or triphenylolmethane triglycidyl ether.

54. The patterning method of claim 50, wherein in step (d), KrF, ArF or $F_2$ eximer laser is used for the exposing.

55. A patterning method for a semiconductor device comprising:
(a) forming a first resist layer on a layer to be etched on a semiconductor substrate;
(b) forming a second resist layer by coating a negative type resist composition comprising an alkali soluble base polymer represented by the following formula:

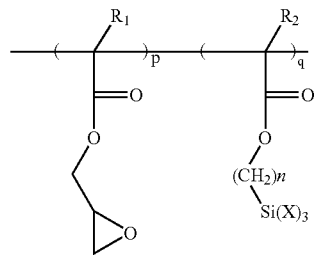

wherein $R_1$ is a hydrogen atom or a methyl group, $R_2$ is a hydrogen atom or methyl group, X is a $C_1$–$C_4$ alkyl, alkoxy, or trimethylsilyloxy group, n is an integer from 2 to 4, and $q/(p\cong q)$ is about 0.1 to about 0.5, a photoacid generator (PAG), and a crosslinking agent formed of a compound having a hydroxy group and cross linkable by reacting with an acid;
(c) pre-baking the second resist layer;
(d) exposing the second resist layer to light;
(e) performing post-exposure baking (PEB) on the exposed second resist layer;
(f) forming a second resist layer pattern by developing the exposed second resist layer;
(g) forming a first resist layer pattern by etching the first resist layer using the second resist layer pattern as an etching mask; and
(h) etching the layer to be etched using the first resist layer pattern as an etching mask.

56. The patterning method of claim 55, wherein the $C_1$–$C_4$ alkly of X is a methyl group.

57. The patterning method of claim 55, wherein the crosslinking agent comprises 1,3,5-tris(2-hydroxyethyl)cyanuric acid, 1,1,1-tris(hydroxymethyl)ethane, triethylene glycol, diethylene glycol, 1,2,6-trihydroxyhexane or trimethylolpropane.

58. The patterning method of claim 55, wherein in step (d), KrF, ArF or $F_2$ eximer laser is used for the exposing.

* * * * *